United States Patent [19]

Sosa Quintana et al.

[11] Patent Number: 5,270,704
[45] Date of Patent: Dec. 14, 1993

[54] AUTONOMOUS PULSE READING AND RECORDING SYSTEM

[75] Inventors: Miguel Sosa Quintana; Eusebio Bautista Vizcaino, both of Las Palmas de Gran Canaria, Spain

[73] Assignee: Union Electrica de Canarias, S.A., Las Palmas de Gran Canaria, Spain

[21] Appl. No.: 708,929

[22] Filed: May 31, 1991

[30] Foreign Application Priority Data

Jun. 4, 1990 [ES] Spain ................................. 9001527
Oct. 23, 1990 [ES] Spain ................................. 9002682
Jan. 25, 1991 [ES] Spain ................................. 9100202

[51] Int. Cl.[5] .................................................. G01D 4/00
[52] U.S. Cl. ........................... 340/870.02; 340/870.03; 340/870.11; 340/870.28; 364/464.04
[58] Field of Search ............ 340/870.02, 870.03, 340/870.11, 870.16, 870.28; 346/14 MR, 33 R; 314/481, 483, 464.04; 324/113, 157

[56] References Cited

U.S. PATENT DOCUMENTS

| | | | |
|---|---|---|---|
| 3,754,250 | 8/1973 | Bruner | 340/870.03 |
| 4,031,513 | 6/1977 | Simciak | 340/870.03 |
| 4,701,698 | 10/1987 | Karlsson et al. | 324/103 R |
| 4,803,632 | 2/1989 | Frew et al. | 340/870.02 |
| 4,862,493 | 8/1989 | Venkataraman et al. | 340/820.02 X |
| 4,868,893 | 9/1989 | Hammond | 340/870.02 |
| 4,940,976 | 7/1990 | Gastouniotis et al. | 340/870.02 |

FOREIGN PATENT DOCUMENTS

342146 11/1989 European Pat. Off. .
3618316 12/1987 Fed. Rep. of Germany .
8103541 12/1981 PCT Int'l Appl. .

OTHER PUBLICATIONS

Siemens Zeitschrift, vol. 49 No. 4, 1975, pp. 185-189 E. Beltz et al; "MAXITAPE, ein Aufzeichnungsgerat des DATAREG-Systems".
IEEE Transactions on Power Delivery, vol. PWRD-2, No. 3 Jul. 1987 pp. 671-676; J. T. Lancaster et al; "Semi-automatic meter reading".

*Primary Examiner*—Donald J. Yusko
*Assistant Examiner*—Michael Horabik
*Attorney, Agent, or Firm*—Darby & Darby

[57] ABSTRACT

An autonomous pulse reading and recording system is aimed at expediting centralised reading of meters generating or sending out pulses, likewise expediting consumption billing. The system is specifically useful for water, gas or electricity meters, but can likewise be used for telephone or telex meters or those used in any other system generating or sending out pulses. The system carries out a wholly automatic serial reading of a number of meters, avoiding possible human errors. Serial reading of the various meters can be effected from a distance, by radio or merely using a portable readout processor or normal computer. Another object of the system is to allow simple and inexpensive increase of the number of meters to be read out.

17 Claims, 9 Drawing Sheets

AUTONOMOUS PULSE READING AND RECORDING SYSTEM

OBJECT OF THE INVENTION

The present invention relates, as set forth in the heading, to an autonomous pulse reading and recording system aimed at expediting centralised reading of meters generating or sending out pulses, likewise expediting consumption billing.

The invention is specifically useful for water, gas or electricity meters, but can likewise be used for telephone or telex meters or those used in any other system generating or sending out pulses.

The invention carries out a wholly automatic serial reading of a number of meters, avoiding possible human errors.

Serial reading of the various meters can be effected from a distance, by radio or merely using a portable read-out processor or normal computer.

Another object of the invention is to allow simple and inexpensive increase of the number of meters to be read out.

BACKGROUND TO THE INVENTION

As to the field of application of the invention, reference is made to European Patent publication number 0 342 146 and German Patent P 3618316.

The German patent comprises an energy consumption data recording and transmitting device essentially designed to be applied in preset energy user areas to meter the respective energy consumptions relying upon energy flows linked to the line by means of spatially distributed meters, transmitted through a remote read-out station at the energy consumer to the energy supplier through a transmission line, moreover recording energy-related breakdown report data through breakdown report transmitters connected to the remote read-out station, which can be transmitted, as energy consumption data, in the opposite direction and in synchrony with the energy flows through the transmission path to the energy supplier.

The disadvantage of this system is that it has to be used in preset user areas, and also requires a transmission line for information exchange between the energy consumer and the supplier of such energy, to which end the remote read-out unit is intelligent and is linked to circuits that must take synchrony into account when transmitting data, which means that this system is extremely complex and uneconomical.

Another disadvantage of the system of the German patent lies in the rigidness of the system, for the intelligent remote readout unit has little capacity to be connected to users, thus making it very difficult to increase the number thereof, unless new intelligent read-out units are incorporated to the system, this being very difficult and leading to excessive additional costs.

Therefore, the device of the German patent is complex and uneconomical.

As to the European patent, such comprises an apparatus to establish communication between an electricity meter, comprising a control circuit through which meter data are provided as output signals, and a manipulable communicator, which meter and the communicator are located within a surrounding of direct and indirect radiation generated by the sun.

Therefore, in the European patent, communication between the meter control circuit and the manipulable communicator, is established at some distance and by infrared rays; to which end it has infrared ray transmission and receiving circuits, thus obliging the apparatus to incorporate additional circuits that can detect the incidence of indirect light caused by the sun within the selected spectrum region, leading to a characteristic output of continuous current whose level corresponds to the intensity thereof, so that only the information sent by the manipulable communicator is detected.

Furthermore, as the apparatus in the European patent has photosensitive receiving means within the meter at the rear portion of the front plate thereof, this latter must be configured so as to have a hole in line with a photodiode and configured to substantially restrict direct access of incident radiation to radiation from sources located under a horizontal plane that extends from the highest portion of the photodiode.

The apparatus of the European patent is therefore complex and uneconomical, apart from reading the electric meter at a short distance.

Tests are also known to have been made to read meters by radio, to which end the meters are connected to an intelligent unit which is itself connected to a transmitter receiver to send out the meter data to a mobile unit present in a vehicle, such comprising a transmitter receiver and a computer.

All the meter equipment feeds directly from the mains and needs a coder to read the meter dial positions, such coder being activated for a short space of time (350 ms) to read the meter dial position and convey this information to the meter microprocessor. The format is a pair parity asynchronous ASCII code serial current. In addition to the meter values, the coder provides a signal to detect unauthorized manipulation that can activate broken wires, magnetic field sensors, voltage loss detectors, and so on. After the message is over, the coder is switched off.

All of this represents a complex and costly system, in addition to posing the typical problems involved in using the mains as feed source.

DESCRIPTION OF THE INVENTION

In order to fully overcome the above disadvantages, the invention comprises an autonomous pulse recording system aimed at expediting centralised reading of meters generating or sending out pulses, besides expediting billing of consumptions, such reading taking place by means of a portable read-out processor without having to use transmission lines, or at a distance using a radio, by means of a system solving the disadvantages of the radio read-out systems.

Another object of the invention is the possibility of increasing the number of meters to be read without having to establish cumbersome connections using economical means.

Thus, in a first embodiment of the invention, the meter is connected to a pulse storage unit.

All pulse storage units are shunted to each other and contained in a box or consolidator module, connectable through a connector to a read-out unit such as a portable reader processor, a MODEM, a radio read-out unit, and so forth.

The consolidator modules can be shunted to other consolidator modules through a five-way bus for connection to the read-out unit.

The pulse storage unit base comprises a special function integrated circuit, solely developed to meter pulses and allow connection to the aforesaid five-way bus, to which a series of pulse storage units may be shunted.

Thus, the special function integrated circuit comprises a binary meter through a pulse generating or emitting meter is connected to meter such pulses, said meters being linked to a latch recorder for a separate reading of the binary meters.

The pulse storage unit, and therefore the special function integrated circuit, has a customer identification number input linked to a multiplexer circuit linked in turn to the latch recorder, so that when the pulse storage unit is queried on a read-out unit, the contents of the binary meters and the customer identification number be transferred, to obtain a reading for the meter status and customer identification number data.

The pulse storage unit has a position meter and a pulse storage unit position code input circuit in the consolidator module, both being connected to a comparator that produces an output signal upon selection of the pulse storage unit.

The pulse storage unit is linked to the five-way bus so as to select the pulse storage unit controlling the position meter status and increasing the meter status that controls the multiplexer selection input bit by bit until the meter status and the customer identification number are read.

The position meter contents are then increased selecting the pulse storage unit whose data are then read.

The meter is a 9 bit position meter, and 512 pulse storage units can therefore be shunted to the same bus, divided into whatever consolidator modules are desired.

Access to the five-way bus is possible at any point through the read out unit.

For every pulse generating meter integrator there is at least a pulse storage unit For instance, a triple rate electricity meter therefore having three integrators will be assigned three pulse storage units.

The pulse storage units have lithium batteries as power sources.

As aforesaid, the pulse storage units can be read by means of a portable reader processor having a five-way bus connection sounder, and also having an oversized source from which, in addition to being self-powered, it feeds each of the pulse storage units upon reading same, in order to minimise consumption of such pulse storage units, thereby increasing their operating autonomy.

The read-out unit can be connected at some distance from the pulse storage units consolidator module, to which end the consolidator module connector can be separated to some extent by means of a protractor in such module, thereby to be able to read the pulse generating meters without having to go near the room or space where the consolidator module or modules are located, read-out unit connection taking place far from the meters.

The system subject hereof can be plugged into other data logging systems such as telephone line data input, infrared or radio distance reading, connection to a MODEM, and so forth.

Connection of the binary meters included in the special function integrated circuit to the pulse generating or emitting meters takes place through an RC filter to avoid noise in the connection cable and to lower consumption when the pulse metering contact is closed.

In a second embodiment, read-out takes place from a distance, using a radio, to which end the invention has a fixed unit comprising an antenna data transmitter receiver and a remote read-out unit directly connected to the data transmitter receiver and to the consolidator module or modules, in which case the portable reader processor is unnecessary.

Another embodiment of the invention to carry out radio distance reading comprises a mobile unit located in a vehicle connected to the battery thereof and including: a portable computer where the program setting forth the day's round and the customers to be read is recorded, and which is plugged into a portable remote read-out unit that is in turn linked to an antenna data transmitter receiver Thus, when a mobile unit is located close to a fixed unit, it is possible for this fixed unit to be queried by the mobile unit that sends out the code that the fixed unit is waiting for, whereupon it answers with the same code acknowledging receipt thereof and proceeding to read the status of each meter in the consolidator module or modules pulse storage units, which statuses are sent out and then received by the mobile unit, that processes and stores same in the portable computer from where they are transferred to the central computer for rating purposes.

The distance read-out unit in the fixed unit has a microprocessor controlling such fixed unit and is plugged into an input port that is in turn connected to a remote control decoder linked to the receiver through a first adaptor circuit, this structure therefore allowing the identification code from the fixed unit sent out by the mobile unit to be received, decoding same so that if such identification code coincides with the code stored in the microprocessor's EPROM memory, the transmitter will be switched on and will send out the same code, advising that it is on call and then proceeding to read the data stored in the consolidator module, sending same to the mobile unit.

On the other hand, the fixed unit's remote read-out unit microprocessor is plugged into a first output port that is in turn plugged into a remote control encoder, through a switch, such encoder also being connected to a second adaptor circuit through which connection to the transmitter takes place, and it is therefore possible to send the identification code and the data read from the consolidator module or modules.

The fixed unit's power pack is connected to the mains and a control circuit is connected to the consolidator module or modules through an adaptor circuit that is in turn connected to a second output port that is linked to a microprocessor. The consolidator module or modules are connected through a third adaptor circuit to the input port, so that the fixed unit supplies the consolidator module or modules when reading same through the input port, sending same out and switching over to receive on ending the emission.

The mobile unit has a portable computer bus adaptor circuit through which it is connected to same without interfering in its own operation.

Such portable computer bus adaptor circuit is located in the portable remote read-out unit, whose structure is identical to that of the fixed unit remote read-out unit, saving the circuitry through which connection to the consolidator modules takes place.

Another embodiment of the invention comprises reading the pulses stored through a portable reader interphase connected through a connector to any conventional computer, and that is also provided with a sounder for connection to the consolidator modules, whereby any normal market computer can proceed to read same directly.

Therefore, with the structure of the invention, fully automatic centralised distance reading of meters in a very short space of time, and/or directly, is possible, moreover allowing the number of meters to be read out to be increased, by merely connecting a pulse storage unit to the same.

In order to contribute to the complete understanding of this specification, a set of drawings is attached as an integral part thereof which, while purely illustrative and not fully comprehensive, shows the object of the invention.

DESCRIPTION OF ONE OR SEVERAL EMBODIMENTS OF THE INVENTION

Figure 1:
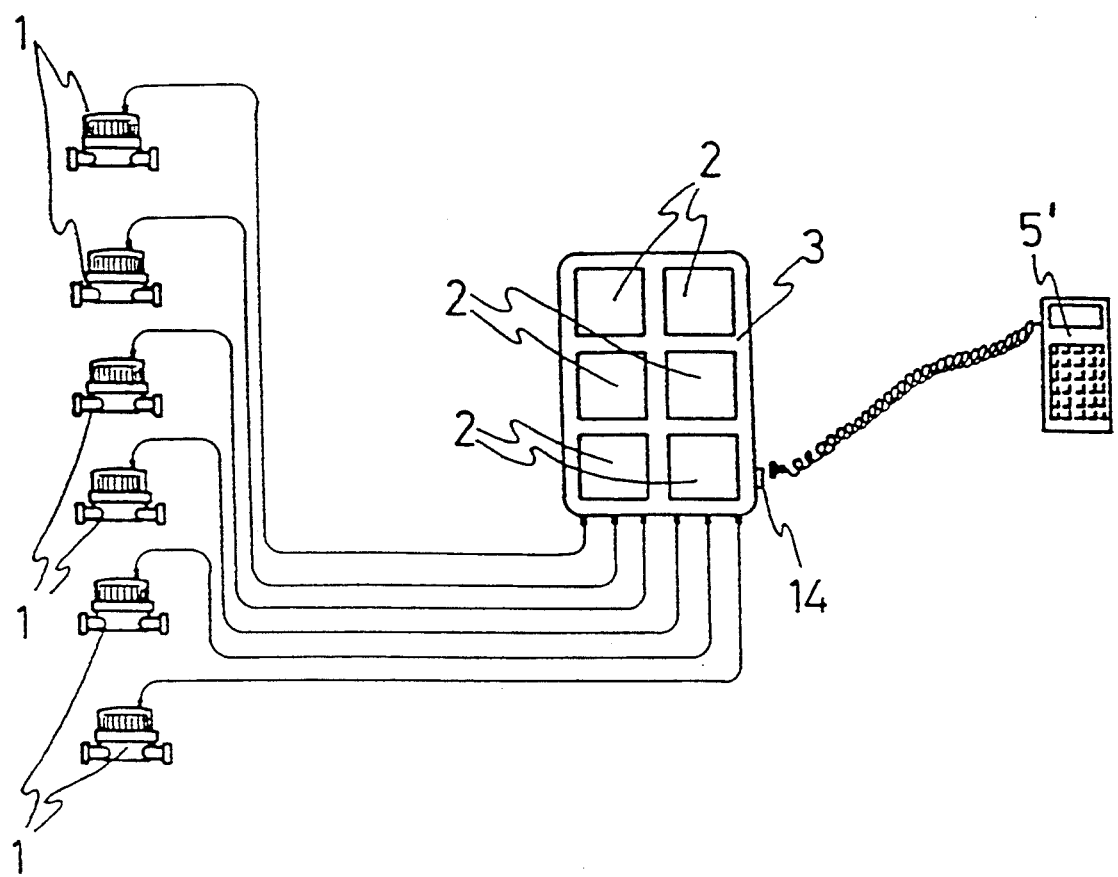
FIG. 1 is a general operational block diagram of an embodiment of the autonomous pulse recording system, in which embodiment water meters are read out using a portable reader.
Figure 2:
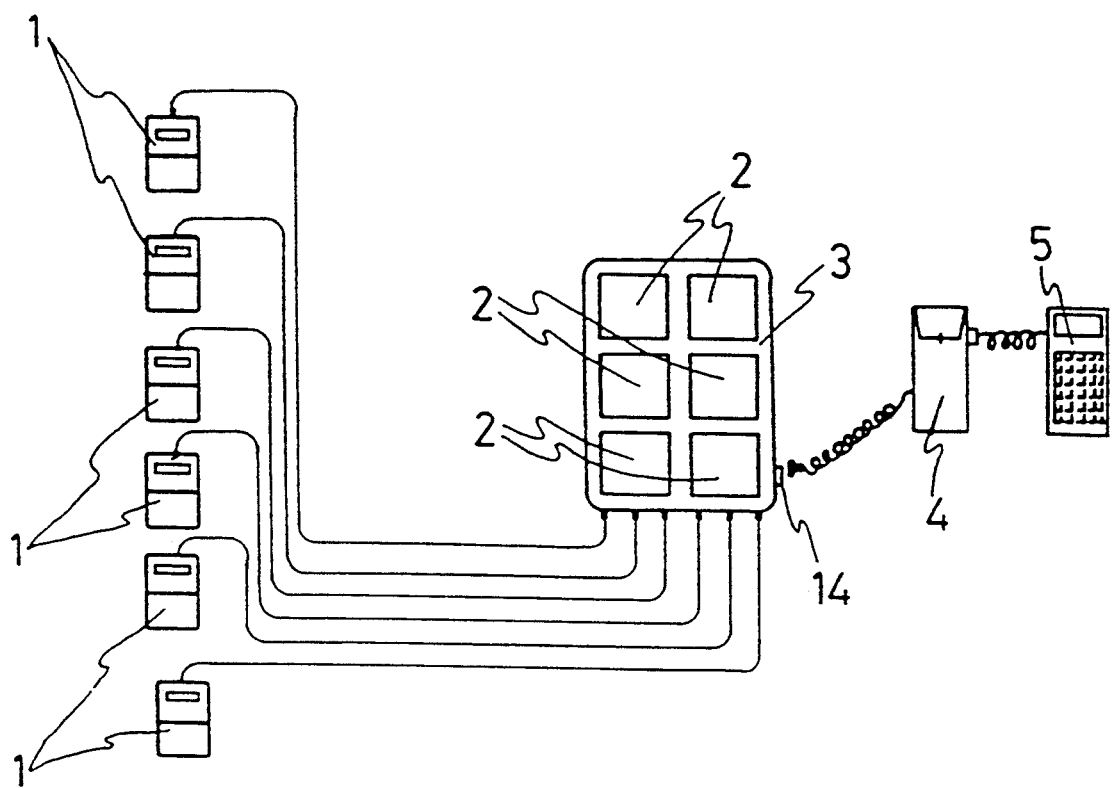
FIG. 2 is a general block diagram of another embodiment where the read-out unit is an interphase portable reader connected to a conventional computer.

A description of the invention follows as represented in the above figures.

In such light, the invention comprises an autonomous pulse recording system aimed at expediting centralised reading of meters generating or sending out pulses, likewise expediting billing of consumptions.

In order to achieve the above objects, a first embodiment of the invention is provided with a series of pulse storage units 2, each connected to a pulse generating or emitting meter 1.

The meter 1 to be connected are preferably water, gas or electricity meters, connection to any of them being possible without any changes or modifications being necessary.

Hence, there is a pulse storage unit 2 for every meter 1.

All pulse storage units 2 are shunted to each other and contained in a consolidator box or module 3 which can be connected through a connector 14, with or without a protractor, to a portable read-out processor 5' which will be described below, whereupon, under this latter's control, the various pulse storage units 2 are queried and read, such units transferring the different statuses of each meter to the read-out unit 5'.

Figure 6:
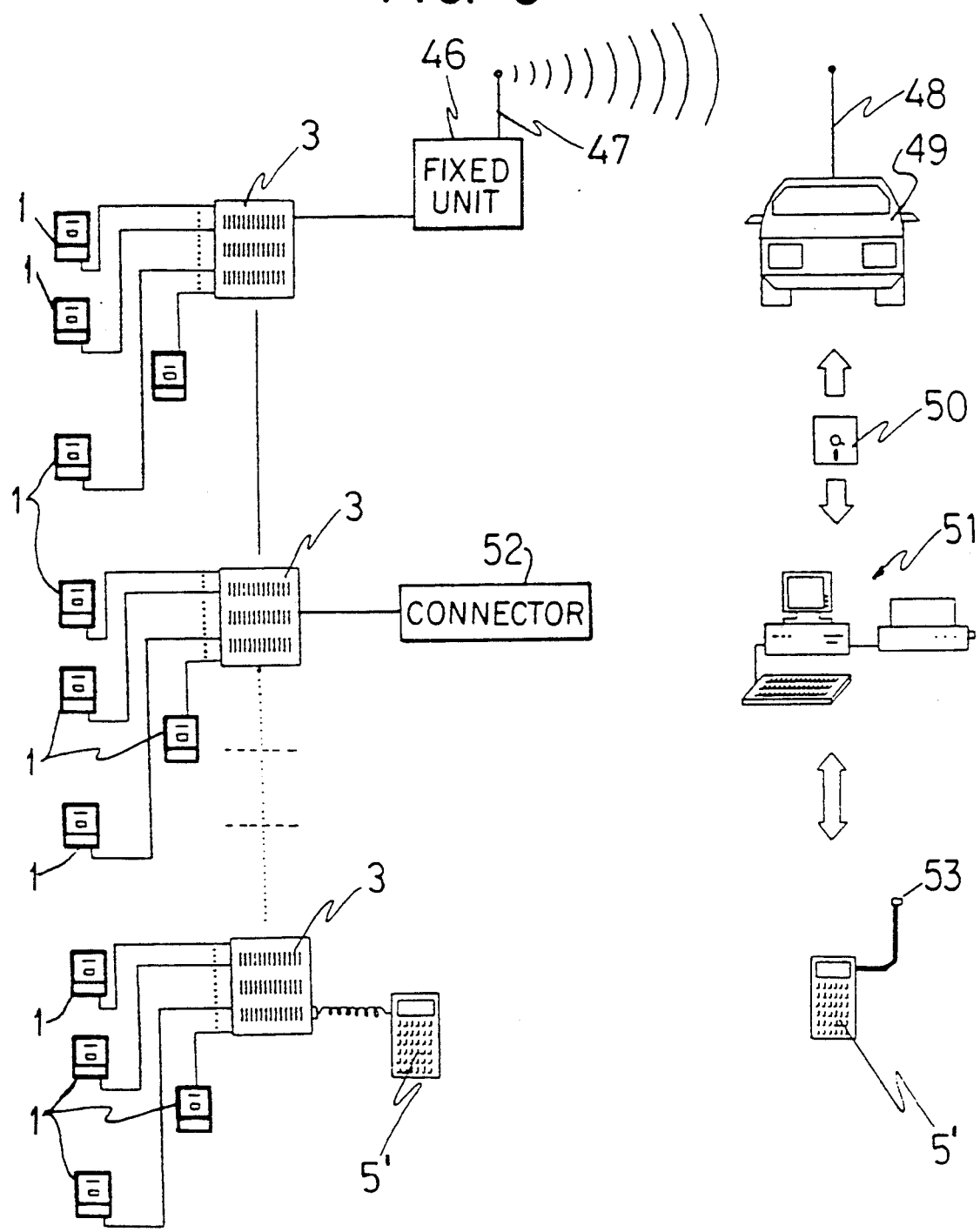
FIG. 6 is a general diagram of another embodiment where the pulse storage units are read by radio, this figure using electricity meters.

Once the data are in the read-out unit, the latter is conveyed and connected to a central computer 51 (FIG. 6) which bills the consumptions. Said central computer (51) is also used to bill the read consumption data obtained by the examples of preferred embodiments disclosed in the instant application.

The pulse storage units 2 are made under CMOS technology, and are self-powered with lithium batteries, thereby to prevent the system in general from being plugged to the mains. The pulse storage unit 2, whose electronic diagram is shown in FIG. 4, comprises an application specific integrated circuit, shown schematically in FIG. 3, having 32 bit binary meters 6 allowing four thousand million units or pulses to be counted continuously (in the embodiment).

Input to the meters 6 takes place through an RC filter, and connection to the meters 1 is through connectors 24, such filter only allowing counting speeds of under 5 pulses per second, rejecting noise in the connection cable to the meters 1 and lowering consumption when the pulse contact is closed.

The binary meters 6 are connected to a series of latch recorders 8 to read out the pulses stored outside the binary meters 6. When it is detected that the pulse storage unit is being queried by the read-out unit, the count is shunted to the latch recorders 8.

Furthermore, the pulse storage unit 2 has a series of inputs 7 to read the user identification code, structured by cutting and drilling in the thin tracks 16 available to such end, and the input lugs are thus joined in positive or negative parallel, depending on whether it is to be set at "1" or "0". The set identification code is read at the same time as the binary meters 6 status, by actuating the read-out unit.

The application specific integrated circuit 19 is provided with a multiplexer circuit 18 connected to the latch recorder 8 and the inputs 7.

Furthermore, the specific function integrated circuit 19 has a position meter 9 and a position code input circuit 10 for the pulse storage unit in the consolidator module, both being connected to a comparator 11 that gives out an output signal upon selection of the pulse storage unit.

The comparator output 11 is connected to a meter 12 controlling the multiplexer 18 selection input, so that upon selection of the pulse storage unit 2 the comparator actuates the meter 12 for the data regarding the status of the meters 1 or pulse generators and the customer's identification code to be obtained at the multiplexer 18 output.

The pulse storage units 2 have lithium batteries for their operation.

The so-called portable reader processor 5' read-out unit has an oversized pack through which it is self-powered, and which provides the operating voltages to each of the pulse storage units when they are read out in order to minimise consumption of such pulse storage units, thus increasing their operating autonomy.

Thus, the RES of the pulse storage unit 2 (FIGS. 3,4) line fulfills two objectives. On the one hand feeds the pulse storage units 2 upon read-out, in order to save the lithium battery charge. On the other, it initialises the pulse storage units position decoder.

Separation of these functions is carried out by diodes and condensers in the pulse storage unit, so that the RES signal is used at a lug, while the power arriving through this route is used to feed the pulse storage unit, shunted with the lithium battery.

At a first instance, and at the bus connector, RES is fed with a supply voltage of some 6.5 volts. The RLJ and SEL (FIGS. 3,4) inputs are fed with a high logical voltage, likewise of 6.5 volts. SDS is also connected with a positive feed resistor of 6.5 volts, contained in the read-out unit, from where the information stored in the pulse storage units will be read.

The RES line goes down to 0 and then becomes positive again, whereupon the position meters 9 are reset at 0.

The position meters 9 are 9 bit meters and may effect a dual count to 512, so that connection of 512 pulse storage units is possible shunted to the bus.

The count attained by all the binary meters 6 on the latch recorders 8 is also dumped. This allows the count attained by the binary meters 6, upon being read from the new latch recorders 8, not to interfere with any new pulse to be counted and produced while reading takes place.

The binary meters 6 are 32 bits just as the latch recorders 9 so that four thousand million pulse units can be counted, as aforesaid.

The input circuit 7 capacity is 24 bits. These 24 bits together with the 32 latch recorder 8 output bits are applied to form a 56 bit word, at the multiplexer 18 input.

With the RES pulse (FIGS. 3,4) at all the pulse storage units 2 application specific integrated circuits 19, the position meter 9 is reset at 0. This meter 9 output is applied to the comparator 11 inputs, this latter also receiving the consolidator module pulse storage unit order number code, both being 9 bit data, the order number's 9 bits generating by manual shunts.

At this instant, the contents of the position meter 9 (which is at 0) and the position of the shunts bridged for position 0 could be identical at some consolidator pulse storage unit, this much being specifically detected by such pulse storage unit comparator (normally the first consolidator pulse storage unit), whereupon a positive identity signal will follow reaching up to the control meter 12 at the multiplexer 18 selection inputs, resetting same.

This may be recognised externally because the comparator 11 positive comparison signal is also applied at the specific function integrated circuit 19 SDS output lug and, through the transistor 21, will earth the similarly denominated SDS five-way bus line.

This signal will advise the read-out unit connected to the five-way bus that there is a bridged card for position 0 at the consolidator to be read. Then, if the read-out unit detects a card 0, the SEL five-way bus line will be switched to a low level, and therefore the multiplexer 19 bit 55, this being the most significant bit in the 32 bit count, will only be connected to the SDS output lug in the specific function integrated circuit 19 selected by the positive identity signal, storing in latch recorder 8.

After this bit is read by the read-out unit from the fiveway bus SDS line, the read-out unit will pulse the five-way bus RLJ line reaching the lug in the similarly denominated specific function integrated circuit 19, at a low level, thereupon to be brought up to a high level, for the meter 12 to move forward and get the multiplexer 18 to provide the following bit in the count.

After this bit 31 is taken from the count by the read-out unit, the latter will continue this process repeatedly, internally reconstructing the pulse storage unit count being read bit by bit.

After finishing with bit 0 in the count, the next bit to appear (32) is bit 23 in the client code, and by repeatedly pulsating RLJ the other bits in the code up to bit 0 in the count are obtained through SDS.

Thus, the read-out unit successfully obtains its count and customer code for position 0 from the encoded pulse storage unit. Then the five-way bus SEL line returns to high level, and pulsating the RLJ line at low and high level, all position meters 9 remaining at 0 will move one step forward, whereupon the position 0 encoded pulse storage unit card is deactivated, and in the event of there being an encoded one for position 1 within the pulse storage unit consolidator, it will be activated, and may be read just like the first one.

In the event of the read-out unit detecting that there is no card for a given position, it will not read same, again pulsating RLJ to search for the following one.

Once the read-out unit has finished with the last consolidator pulse storage unit, linked to the same five-way bus, it proceeds to take a second reading of the whole consolidator, storing the contents of the second reading.

Both readings are set aside and the reading is only validated if both are in agreement, i.e., if the number of pulse storage units read and all their codes, and the number of pulses counted are the same. There is some leeway for the number of pulses in the second read-out to be slightly higher than the first one.

In the event of a difference in the readings, the read-out unit will carry out two more readings to set them aside again. This read-out procedure will be repeated up to five times, though it can be programmed and can be increased or decreased.

After setting both readings aside, and if there are no differences, the read-out unit will start the information procedure.

INP, SEL and RLJ inputs of the application specific integrated circuit 19 in the pulse storage unit 2, take place through the SCHMITT trigger to increase immune noise in the lines or cables. The other inputs, 16, 20 and RES (FIGS. 3,4) are normal logic inputs without PULL-UP or PULL-DOWN, for there to be the least possible power cost, bridging such lines at a low or high level, depending on whether they are part of the code or they are reader control lines.

Internally, in the specific function integrated circuit 19, the customer code signal lines 20 are connected to a series of logic gates decoding the customer codes εHFFFFFF and εHFFFFFE.

The code εHFFFFFF is useful for resetting the customer meter at 0, when fitting the battery. The code εHFFFFFE is used at the application specific integrated circuit 19 manufacturing stage to activate the circuitry useful for testing all the internal specific function integrated circuit modules.

The customer identification code comprises a series of tracks 16 that are originally all joined together, those necessary for forming the binary code in the customer number to be assigned to the pulse storage unit 2 being cut.

The earth track in the printed circuit, to which all the bridges that must take a low level are connected, is not earthed directly, but passes through a separation resistor that allows, by momentarily joining two points in the printed circuit, all inputs 16 to be applied a high level.

This condition is connection through a special circuitry in the specific function integrated circuit 19 and causes the binary meter 6 to be reset at 0, in order to initialise the meter during assembly of the pulse storage units 2 and when the batteries are installed.

Therefore, the customer identification code is not prestored internally, but as it is not possible for it to be altered in any case, it is simply connected directly from the multiplexer 18 input gates.

The external connector 14 in the aforesaid consolidator box or module 3 can be located far from such module 3, if the meters 1 are to be read without going into the room or space where they are located. For this case, the connector has been assigned numeral 52 in the drawings as an external box is required.

One external connector 14 may also be incorporated, one in the consolidator module 3 and the other one 52 outside the meters 1 premises, for read-out to be possible in either place at will.

The maximum distance attained heretofore between the consolidator module 3 and the reading connector can be 100 m.

Another characteristic of the consolidator module 3 lies in that various ones located at different points can be connected to each other, and all be read out from the one spot, provided that all the consolidator modules 3 when connected to each other, do not altogether represent more than the 512 maximum pulse storage units 2, as in the embodiment, which number can be extended where necessary.

All these possibilities allow all sorts of combinations to be made, with a view to non-standard installations, for instance, buildings with water meters on each floor, and that must nowadays be read one by one.

The invention allows a consolidator module 3 to be fitted on each floor with the necessary pulse storage units (4, 6 or 8, depending on the number of flats per floor). Each consolidator module 3 is interconnected with the one on the floor below through a single cable that carries the aforesaid five extensions. This cable ends in the building lobby, at said external connector 52 where the portable reader interphase circuit 4 or the portable reader 5' is connected, to read all the building's meters.

one of the read-out units comprises the portable read out processor 5' mentioned before, and another of these units could be a portable reader interphase 4 to which a conventional computer 5 is connected, so that the portable reader interphase 4 is another reader means allowing connection of any computer 5 with a serial port, through which the pulse storage units 2 contained in the consolidator modules 3 are read by connecting the five-way bus in a five-way connector.

The portable reader interphase 4 comprises a physical means through which it is possible to view the count stored in each of the pulse storage units 2. The stored count is read through the five-way bus to which all the pulse storage units 2 are connected, within the consolidator module 3, and which by means of a cable and a connector 14 are rendered accessible from anywhere, as explained hereinbefore.

Figure 5:
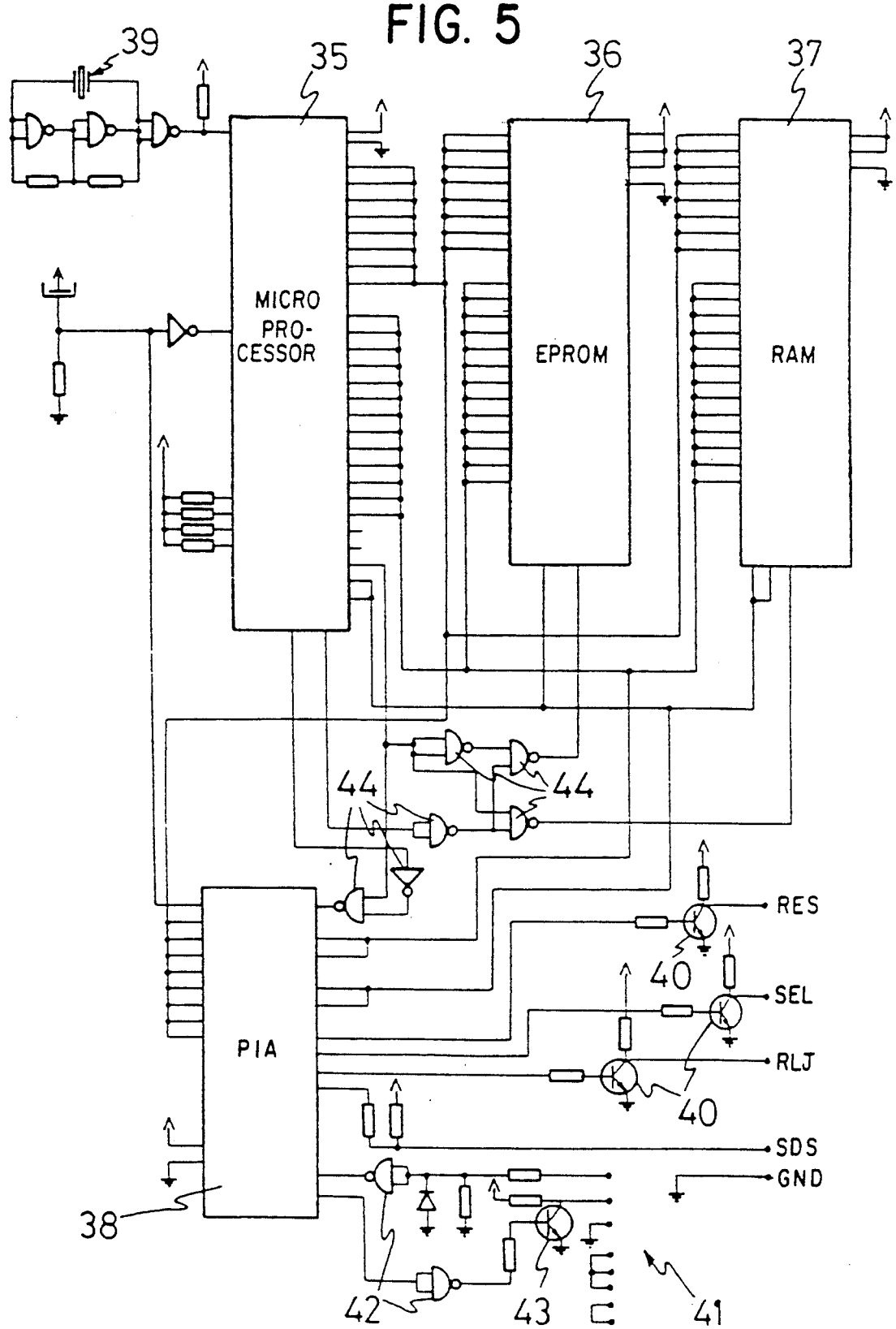
FIG. 5 is an electronic diagram of the portable reader interphase circuit, through which the pulse storage unit is read out under the control of a conventional portable computer.

The portable reader interphase circuit 4 is a device shaped as a hamper with a strap, for easy cross belt movement thereof. The portable reader interphase circuit 4 has a microprocessor 35 (FIG. 5) that represents the said portable reader interphase circuit 4 operating base. The microprocessor 35 is connected to an EPROM type memory program 36, a RAM type working memory 37 and a PIA type peripherals adaptor circuit 38.

The microprocessor 35 is connected to an oscillator 39 for same to operate correctly.

The peripherals adaptor circuit 38 makes connection possible through the signal amplifier transistors 40, to each of the various pulse storage units 2 through the RES, SEL, RLJ, SDS and GND tracks connected to the tracks of the same denomination of the application specific integrated circuit 19 in the pulse storage unit 2 which requests data according to the hereinabove described method.

Figure 3:
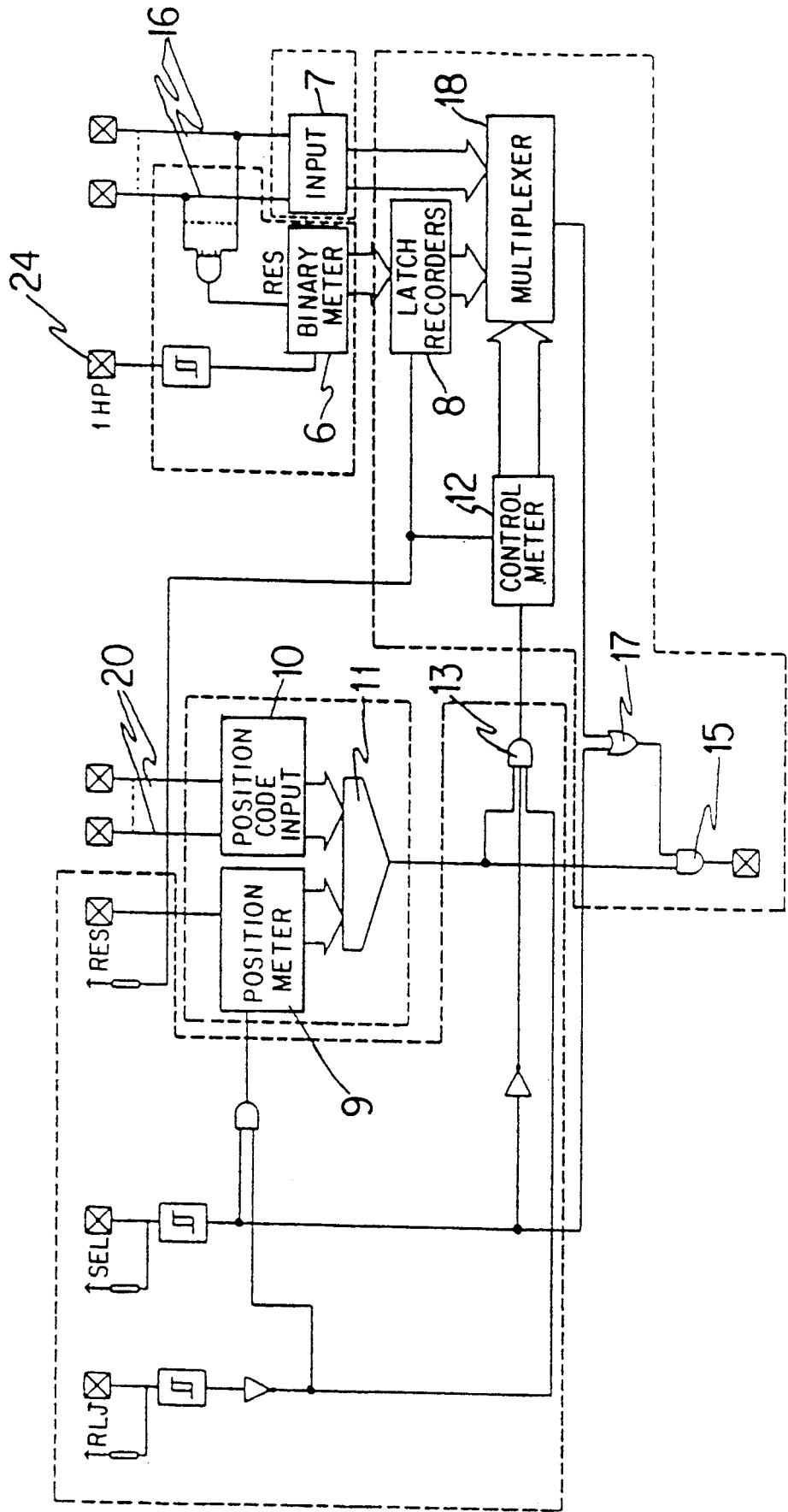
FIG. 3 is a schematic view of the application specific integrated circuit.
Figure 4:
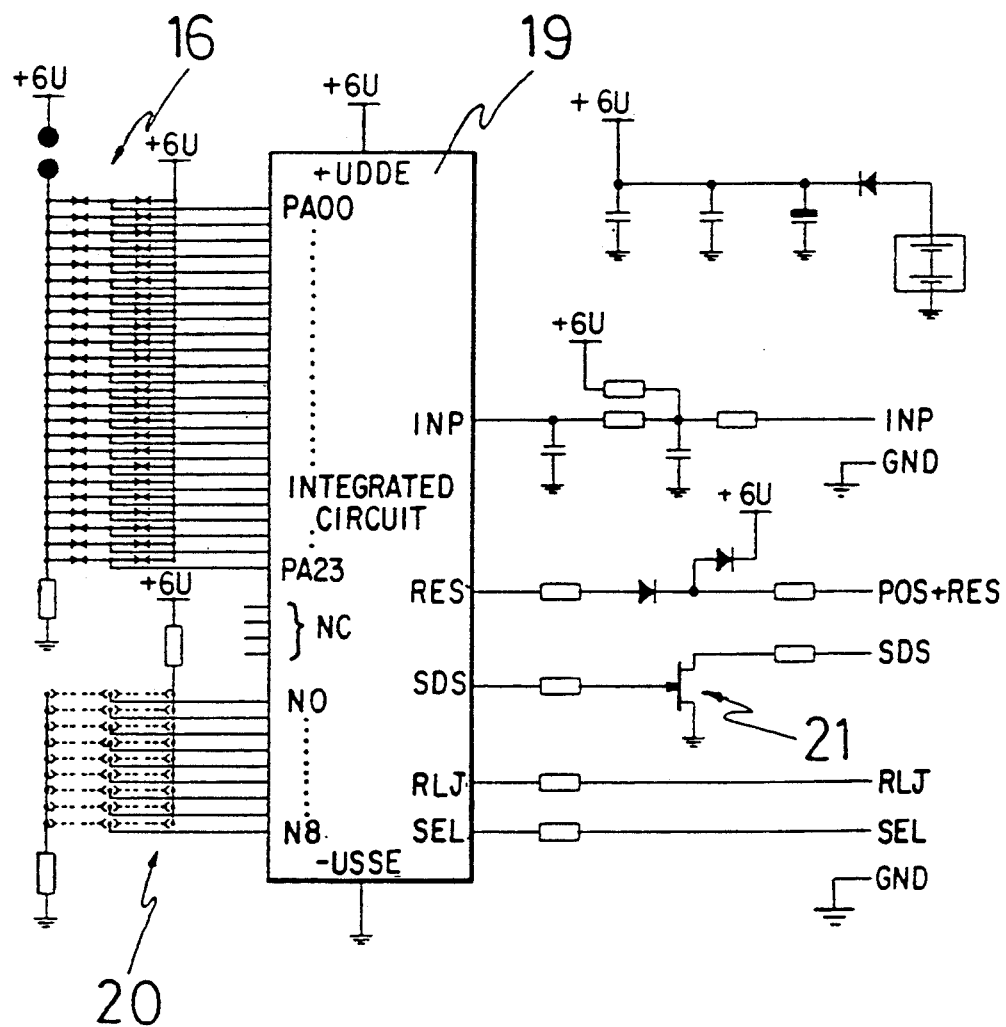
FIG. 4 is an electronic diagram of a pulse storage unit comprising a application specific integrated circuit (ASIC) connected to the relevant meter, and to the relevant read-out unit.

Furthermore, the peripherals adaptor circuit 38 has a serial communication channel for connection to a conventional portable computer 5 through the connectors 41 that are connected to such communications channel through the logic gates 42 and the signal amplifier transistor 43, as well as through the elements shown in FIG. 3 and related thereto.

The logic gates 44 select each of the aforesaid elements according to the direction given.

The microprocessor 35, when switched on for the first time, proceeds to initialise all input or output signals, both in the reader sounder and in the communications connector 41, through the suitable program in the peripherals adaptor circuit 38. Furthermore, the different areas in the RAM memory 37 are prepared according to the subsequent use it will be given, waiting for orders from the conventional portable computer 5 through the serial communications line.

Thus, the conventional portable computer 5 sends an RES signal to the portable reader interphase circuit 4 which recognises such signal and proceeds to initialise as aforesaid.

There is also a control command that when recognised by the portable read-out interphase circuit 4 proceeds to send a text line through the serial port 41 indicating the model and version of the program with which it is loaded.

When the conventional portable computer 5 sends the reader signal to the portable read-out interphase circuit 4, on receipt of the command, it proceeds to send the relevant signals to the read-out sounder, for reading of the data in each of the pulse storage units 2 to take place, as previously explained. When all this information has been collected from the pulse storage units 2, contained in the consolidator module 3, to which the portable reader interphase circuit 4 read-out sounder is connected, through the connector 14, the process for conversion into a series of text lines begins, with a fixed format of 21 characters, subsequently sending same through serial line 41.

Upon receipt of these lines, the program in the conventional portable computer 5 will update its database, contained in the data processing centre, searching the file with the codes found and replacing the pulses read last time with the new ones, adding the reading date.

Thus, when the conventional portable computer 5 is connected to the central computer 51 this latter proceeds to rate as appropriate, issuing the relevant bill at such rates.

The portable read-out interphase circuit 4 supplies each of the pulse storage units 2, when it reads, through a battery attached to such circuit, which battery can be recharged.

Figure 7:
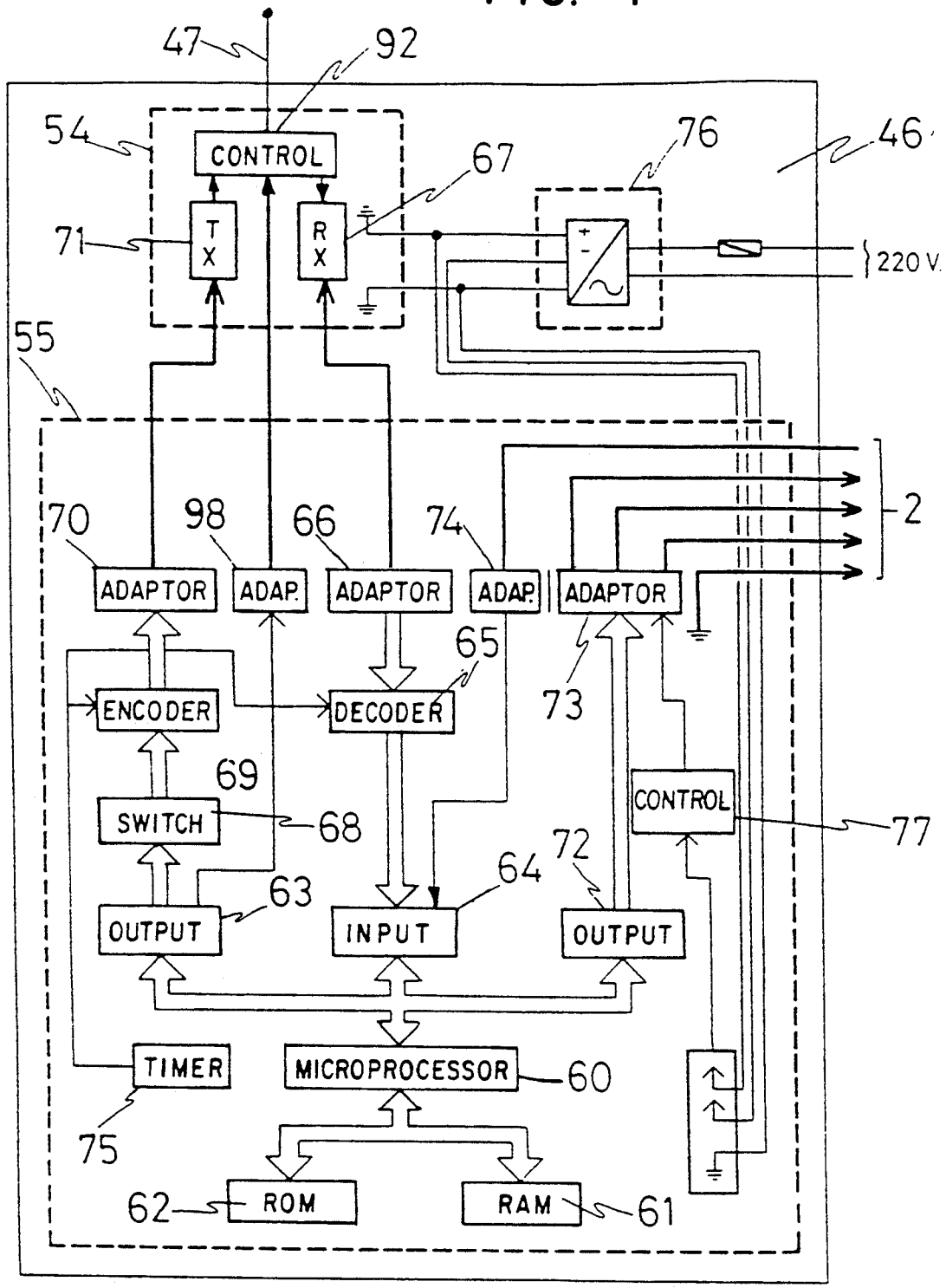
FIG. 7 is a block diagram of the fixed unit designed for radio read-out connected to at least a consolidator module, each of which houses a series of pulse storage units, in order to transmit the data stored therein by electromagnetic waves.

In another embodiment, the meters can be read out automatically from a distance, to which end the consolidator modules 3, that can be connected to one or more consolidator modules 3, are connected to a fixed unit 46 (FIGS. 6,7) provided with a data transmitter receiver 54 through which signals are sent out and received through an antenna 47.

The data transmitter receiver 54 is connected to a remote read-out unit 55 through which connection to the consolidator module or modules 3 takes place.

Figure 8:
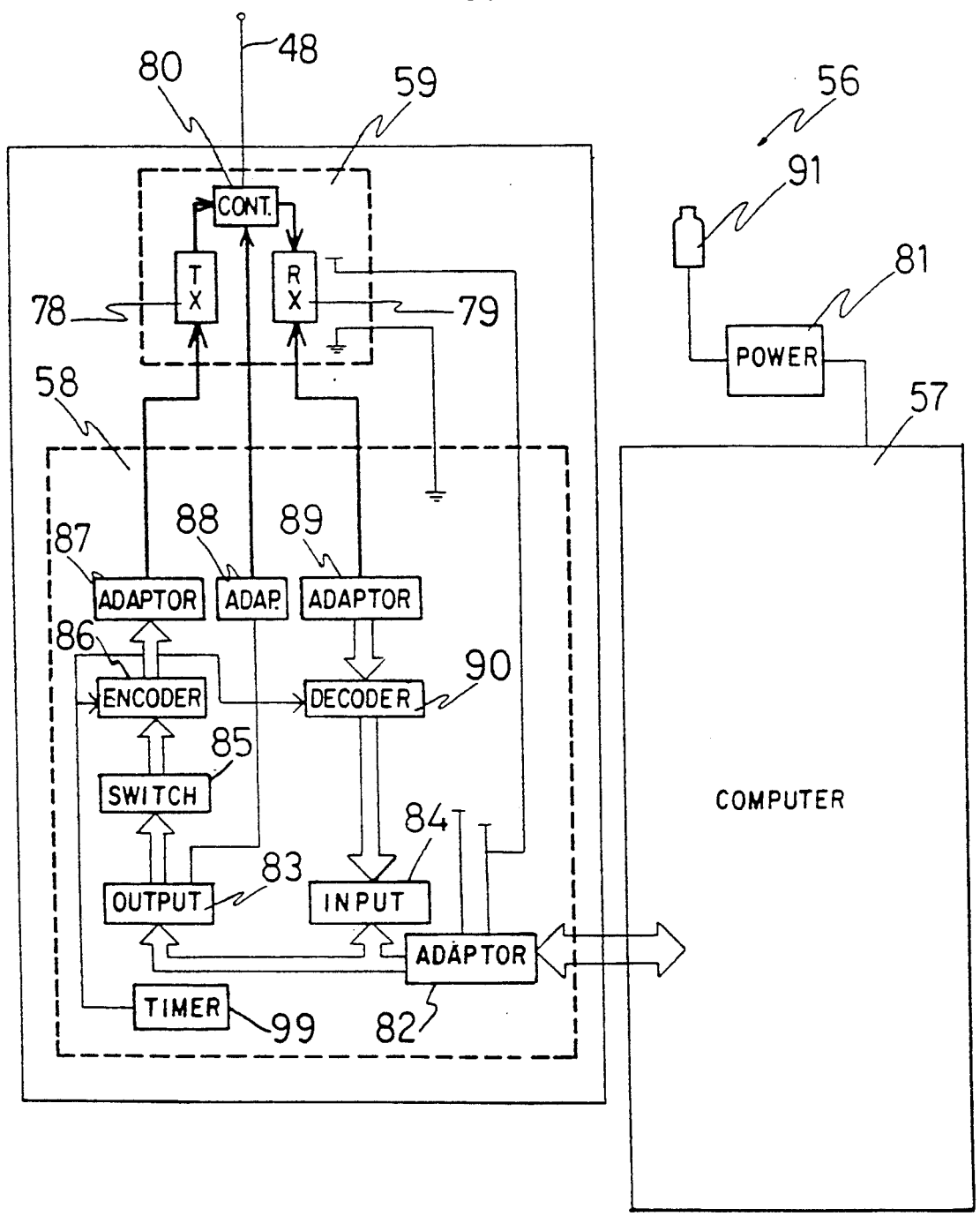
FIG. 8 is a block diagram of the mobile unit located in a vehicle through which the meters are read out from a distance.
Figure 9:
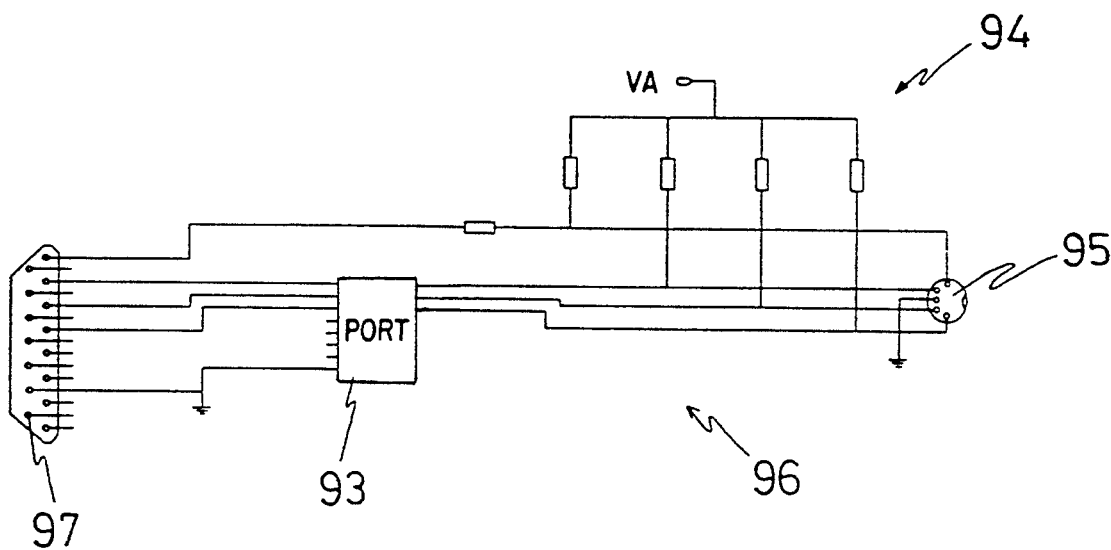
FIG. 9 are the elements added to the microcomputer comprising the portable read-out computer, being yet another embodiment to read the pulse storage units directly.

Furthermore, in the third embodiment, the invention has a mobile unit 56 (FIG. 8) that is located in a vehicle 49 (FIG. 7) and is connected to the battery thereof.

The mobile unit 56 comprises a portable computer 57 connected to a portable remote read-out unit 58 connected to the portable computer 57 that is in turn connected to a data transmitter receiver 59 through which data are sent and received through an antenna 48.

The portable computer 57 stores the program with the day's round and the customers to be read, which information is provided by the central computer 51, just as in the previous example, through hardware 50, such as removable hard disks or high density floppy disks.

Once on the round, the program running in the portable computer 57 controls said portable remote read-out unit (58), which queries the said fixed unit through the data transmitter receiver 59 once located near the fixed unit 46, which reads the data stored in the consolidator modules 3 and sends same to such mobile unit 56, which processes the data in the portable computer 57, from where they are conveyed to the central computer 51 to be billed.

Operation of the fixed unit remote read-out unit 55 (FIG. 7) relies upon a microprocessor 60 through which the remote read-out control unit 55 is read and assisted by its relevant EPROM program memory.

Furthermore, the microprocessor 60 is connected to a RAM 61 memory and a ROM 62 memory.

The remote read-out unit 55 has an input port 64 which is in turn connected to a decoder 65 which, through an adaptor circuit 66 is connected to the receiver 67 in the data transmitter receiver 54. On the other hand, the remote read-out unit 55 has a first output port 63 which is connected, through a switch 68, to an encoder 69.

The encoder 69 is connected, through a second adaptor circuit 70, to the transmitter 71 included in the data transmitter receiver 54.

The first output port 63 is connected through an adaptor circuit 98 to an electronic circuit 92 that controls the data transmitter receiver 54 status (in transmission or acceptance).

The microprocessor 60 is connected to a second output port 72 through which connection to the different consolidator modules 3 takes place through an adaptor circuit 73.

The input port 64 is connected to the consolidator modules 3 through an adaptor circuit 74 through which the data as to the status of the meters 1 are received.

The numbering 75 is the timer that allows suitable operation of the remote read-out unit 5.

When at rest, the transmitter 71 is off and the receiver 67 on, waiting to receive orders through the radio. To identify each of the different fixed units 46, (FIGS. 6,7) these latter incorporate an identification number stored in the EPROM memory thereof.

Each time the remote read-out unit receives a command, it is decoded by the decoder 65 and compared with that in the microprocessor's 60 EPROM memory and if they coincide it first gives the command received through the encoder 69 and sends through the transmitter 71. It then proceeds to read all the pulse storage units connected to the fixed unit 46, integrated in one or several consolidator modules 3. The pulse storage units are read several times to avoid errors, and after verifying that the read-outs coincide, these are sent by the fixed unit 46 through its transmitter 71 to the mobile unit 56.

The fixed unit 46 then disconnects the transmitter part 71 and again awaits receipt of new data.

The mobile unit can be assembled in any sort of vehicle 49, even a motorbike, provided that it is powered at 12 volts direct current.

It should be noted that the fixed unit 46 is supplied by a power pack 76 connected to a control circuit 77 that is in turn connected to an adaptor circuit 73, so that when the pulse storage units are read though the fixed unit 46, these are supplied by the fixed unit 46 through the control 77, and consumption of the pulse storage units is therefore lowered.

For its part, the mobile unit 56, as aforesaid, has a data transmitter receiver circuit identical 59 (FIG. 8) to that of the fixed unit 46, saving that it is powered through the vehicle battery.

Therefore, the mobile unit 56 data transmitter receiver 59 has a transmitter 78, a receiver 79 and the electronic circuit 80 controlling the status of the data transmitter receiver 59.

The remote read-out unit on the portable computer 58 does not carry a microprocessor, for its functions are carried out by the portable computer 57 connected to the vehicle's lighter 91 and receives the required operating voltages through the direct current/direct current power pack 81.

Connection of the portable computer 57 to the portable remote read-out unit 58 takes place through an adaptor circuit 82 to the portable computer 57 bus.

The portable remote read-out unit 58 has an output port 83 connected, through a switch 85, to an encoder 86. The encoder 86 is connected to the transmitter 78 through an adaptor circuit 87.

Furthermore, the output port 83 is connected to an adaptor circuit 88 that is in turn connected to the electronic circuit controlling the status of the data transmitter receiver.

Furthermore, the portable remote read-out unit 58 has an input port 84 connected to a decoder 90, and the latter to the receiver 79 through an adaptor circuit 89.

The reference 99 represents the timer that allows suitable operation of the unit.

Therefore, each time the mobile unit 56 queries a fixed unit 46, the latter waits to detect the acknowledgement of receipt from the fixed unit 46 that comprises the identification code, and therefore if such acknowledgement is not received in a few seconds, it again queries the same fixed unit 46 up to three times running. If it fails to get the read-out, a possible communications problem appears in the incidents record.

If the acknowledgement of receipt does arrive, the portable computer 57 waits for the fixed unit 46 remote read-out unit 55 to read the consolidator modules 3 and start to transmit. Once all the data has reached the portable computer 57, the CHECKSUM and format thereof is verified, and if the data are correct, other possible fixed units 46 located nearby, accessible from the same vehicle location 49, are read.

Once all the nearby fixed units 46 have been read, the portable computer 57 indicates the vehicle driver the following location to which he must go to carry out other readings. Then, and while the vehicle is changing location, the portable computer processes the data received, and updates the database files with the parameters that have just been read, adding the date and time (taken from the actual portable computer 57) they were read at.

Any incident, for instance meters without consumption, negative readings or readings beyond expected values, are logged under "incidents".

The database or databases in the mobile unit 56 portable computer 57 are loaded from the data processing centre or central computer 51 at the company managing the meters 1 readings and bills. The data processed by the portable computer 57 in the mobile unit 56 are also delivered at the same data processing centre 51.

This exchange can be effected in many ways: by direct high speed serial links, by provisional integration of the mobile personal computer in the same "data network" (directly or through a MODEM), dumping and verifying as appropriate, or by exchanging the actual information hardware, for instance removable hard disks or high density floppy disks, as aforesaid.

The pair of remote control encoders-decoders 69, 65 and 86, 90, respectively, are used to ensure that the link between both fixed 46 and mobile 56 units is reliable. As these units are designed to work in an adverse environment, they are already fitted with a number of features that improve communication parameters.

The remote control encoders-decoders used work by modulating wide pulses, this allowing in turn modulation of the means driving the signal, by means of an "all" or "nothing" system.

This system is used to effect simple frequency displacement within the same channel width (12.5 KHZ) in the assigned 70 MHZ band, an FSK type modulation taking place quite simply that is easier to modulate.

The actual remote control devices carry an integrated function that decreases the possibility of faulty operation. Two characters must be received in a row to confirm that same is appropriate. Thus, the probability of defect or error is very small.

Using the remote control devices, the microprocessor 60 no longer has to decode the communication signal and carry out this security control, and therefore programming is simpler and more efficient.

In the embodiment where read-out of stored pulses takes place by means of a portable read-out processor 5', this latter comprises a PC minicomputer fitted with rechargeable batteries to supply the pulse storage units when directly reading same, as aforesaid.

The portable reader processor has a sounder 96 connected to the PC minicomputer by means of a connector 97.

The sounder 96 ends in a connector into which the consolidator module or modules 3 are plugged.

The portable reader processor 5' referred to earlier in this application has a parallel port 93 arranged between the connector 97 and 95, where the sounder 96 is inserted, through which the pulse memory units are directly read.

The minicomputer EPROM memory also records the functions that must normally work in the portable read-out processor 5', and it is not necessary to load same from any other equipment, since it is recorded at the same time as the operative system is recorded, and therefore it is not possible for the portable readout processor 5' to lose the program.

All of the above allows the unctions of the portable readout processor 5' to be developed easily in any other computer having the same or a similar microprocessor and operative system, and only after being verified and checked are they permanently stored in the minicompatible.

Thus, the portable read-out processor 5' is complemented with a highly operative system, rapidly adaptable to any working system implanted in the billing company.

A RAM CMOS type working memory with 256 Kc capacity allows an extensive database or read-out rounds to be loaded, to be used by the meter reader.

A connector 53 for the two-directional serial port compatible with RS 232 rules allows the exchange of data with the central computer 51, and it is therefore possible to load the rounds to be read, or the data, once they have been read, directly, or through a MODEM.

The portable read-out processor 51 works as follows:

Each time it is switched on, it checks itself for basic operation of the equipment, moreover proceeding to initialise all the output or input signals, in both the read-out sounder and the communications connector and liquid crystal display.

Then, a presentation message is sent to the display, and an order or command request goes up on screen. The program shows the actions that can be carried out at that moment on screen, and the operator chooses the relevant option, by merely pressing the key with the first letter of the operation.

Each option can in turn have suboptions selected by this same procedure of pressing the first letter.

The options displayed on screen, can carry out manifold jobs and can vary according to the function desired.

Some of these options are protected by access codes, so that only authorised persons in the data processing centre at the central computer 51 or managers can carry them out, and the operator or reader cannot start same. For instance, timer change, equipment number change, etc.

Therefore, the technology described provides a low cost system which is very easy and simple to install, and provides rapid read-out since up to 512 pulse storage units 2 can be read simultaneously, this being a very significant advantage.

It also allows read-out from a distance, from the location of the consolidator module 3 to the external connector 52 mentioned above, which possibility, at no extra cost, avoids having to go into customers' homes, namely detached houses, and effect the reading from the outside.

It should also be noted that the invention can be used, with no changes, to read any sort of meters.

The fact that supply to each of the pulse storage units 2 through the read-out unit circuit takes place when reading same, allows the power supply battery used in the pulse storage units 2 to be less expensive than those used heretofore, without the operating period being any shorter, since consumption is low and duration of the batteries higher, it being unnecessary to use very expensive batteries.

The low consumption is backed by CMOS technology, used in the subject system, as aforesaid.

We claim:

1. An autonomous pulse reading and recording system for expediting collective and individualized reading of water, gas and/or electricity consumption meters, each of said meters generating pulse signals indicative of the consumption measured by each meter, the system also for transferring said pulse signals to a central computer for processing, comprising:
   a plurality of pulse storage units for storing said generated pulse signals, one of each connected to each of the meters, each of said pulse storage units being identified by a unique identification code, each of said pulse storage units having an independent electrical power supply power to the pulse storage units for storing said pulse signals;
   a first read-out means for receiving the pulse signal information indicative of the number of pulses stored to said pulse storage units;
   a connector means integrally attached to at least one of said pulse storage units for simultaneously connecting said pulse storage units to said first read-out means, said first read-out means sending control signals to query each of said pulse storage units through said connector means such that said pulse storage units will respond by transferring the number of said stored pulse signals and said unique identification codes to said first read-out means, said pulse signals and said identification codes being stored in said read-out means and subsequently transferred to said central computer by said first read-out means, said first read-out means providing electrical power to said pulse storage units when connected thereto.

2. An autonomous pulse reading and recording system as in claim 22 further comprising:
   a consolidator module housing at least one of said pulse storage units;
   a fixed unit having a first transmitter/receiver, said fixed unit connected to said consolidator module;
   said system further comprising a remote read-out unit connected to said first transmitter/receiver and to said consolidator module;
   a mobile unit having a second transmitter/receiver and comprising a portable computer containing identification information for a plurality of said meters;
   a portable remote read-out unit within said mobile unit and connected to said second transmitter/receiver, such that when said mobile unit is in proximity to said fixed unit said mobile unit will transmit identifications codes to said fixed unit connected through said connector means to said pulse storage units such that said pulse storage units will transfer the number of stored pulse signals to said mobile unit through said consolidator modules.

3. An autonomous pulse reading and recording system as in claim 2, wherein the first read-out means has a microprocessor controlling said remote read-out unit and connected to a remote control decoder being connected to the receiver such that the identification information sent out by the mobile unit is decoded; wherein if the decoded information coincides with a code stored in the microprocessor's EPROM, the first transmitter/receiver is switched on and sends out the same code and then reads the data stored in each pulse storage unit and sends said data to the mobile unit.

4. An autonomous pulse reading and recording system, as in claim 2, wherein said fixed unit has a power supply, the fixed unit power supply is connected to a control circuit that is connected to each of the pulse storage units connected to the consolidator module such that the fixed unit will power each of said pulse storage units when data are transmitted through said connector means.

5. An autonomous pulse reading and recording system as in claim 1, wherein at least one of said pulse storage units comprises:
   activation means for causing said pulse storage unit to transfer the number of said stored pulse signals to said first read-out means; and
   means for receiving electrical power from said first read-out means and for powering said transfer of said number of stored pulse signals to said first read-out means.

6. An autonomous pulse reading and recording system as in claim 1, wherein said read-out means is a portable read-out interface and a computer.

7. An autonomous pulse reading and recording system as in claim 1, wherein one of said pulse storage units is grouped with at least one other of said pulse storage units, said one and said other pulse storage units being connected to a consolidator module, said consolidator module having a connector such that said read-out means is connected to said one and said other pulse storage units simultaneously.

8. An autonomous pulse reading and recording system as in claim 7, wherein said consolidator module is connected to another consolidator module such that said read-out means is connected to both of said consolidator modules simultaneously.

9. An autonomous pulse reading and recording system as in claim 1, wherein said read-out means comprises:
   a first read-out unit connected to said connector means; and
   a second remote read-out unit;
   said first read-out unit having a first transmitter/receiver for receiving second control signals from said second read-out unit and for transmitting said number of pulse signals to said second read-out unit;
   said second read-out unit having a second transmitter/receiver for transmitting signals to said first read-out unit such that said first read-out unit will query said pulse storage units and for receiving said number of pulse signals from said first read-out unit.

10. An autonomous pulse reading and recording system as in claim 9, wherein said second read-out is located in a vehicle.

11. An autonomous pulse reading and recording system for expediting collective and individualized reading of a plurality of meters that generate pulse signals indicative of the consumption measured by said meters, said system being constructed such that reading is effectuated in one of a direct mode and a radio transmission mode, comprising:
   a central computer for processing said pulse signals received from the meters;
   means for storing said generated pulse signals comprising a plurality of pulse storage units one each connected to each of the meters, each of said pulse storage units being constructed to connect to a number of other of said pulse storage units, each of which is also connected to a respective meter;
   a consolidator module housing a predetermined group of said pulse storage units;

a first read-out unit;

a connector means in said module for simultaneously connecting said group of pulse storage units to said first read-out unit, said first read-out unit sending control signals to query each of said pulse storage units through said connector means such that said pulse storage units will respond by transferring the number of said stored pulse signals to said first read-out unit, said number of pulse signals being stored in said read-out unit and subsequently transferred to said central computer;

said module being constructed to connect to another consolidator module such that said first read-out unit receives pulse signals from substantially all of said pulse storage units connected to said modules;

wherein each of said pulse storage units comprises an application specific integrated circuit having binary meters through which said respective meter is connected, said binary meters being connected to a series of latch recorders to make an independent reading of said binary meters, said binary meters being connected to logic gates through which the first read-out unit is connected, said pulse storage unit being provided with a series of input used to read meter identification information, such that when the pulse storage unit is queried by the first read-out unit the contents of the binary meters and the identification information are transferred to said read-out unit.

12. An autonomous pulse reading and recording system, as in claim 11 wherein each of the pulse storage units has a battery, the first read-out unit being provided with a battery means that supplies said read-out unit and each of the pulse storage units when said pulse storage units are queried such that consumption of said batteries in said pulse storage units is minimized.

13. An autonomous pulse reading and recording system, as in claim 11, wherein the read-out unit is a portable read-out interface having a microprocessor connected to a RAM memory and an EPROM memory and a peripherals adaptor circuit through which circuit said interface is connected to the pulse storage unit, said peripherals adaptor circuit being provided with a serial communication channel for connection to a portable computer.

14. An autonomous pulse reading and recording system, as in claim 13 wherein the connector means is separable from the consolidator module such that the pulse generating meters are readable remotely.

15. An autonomous pulse reading and recording system, as in claim 14 wherein the connection of the application specific integrated circuit binary meters takes place through an RC filter to reject noise in the connector means.

16. An autonomous pulse reading and recording system for expediting collective and individualized reading of a plurality of meters that generate pulse signals indicative of the consumption measured by said meters, said system being constructed such that reading is effectuated in one of a direct mode and a radio transmission mode, comprising:

a central computer for processing said pulse signals received from the meters;

means for storing said generated pulse signals comprising a plurality of pulse storage units one each connected to each of the meters, each of said pulse storage units being constructed to connect to a number of other of said pulse storage units, each of which is also connected to a respective meter;

a consolidator module housing a predetermined group of said pulse storage units;

a first read-out unit;

a connector means in said module for simultaneously connecting said group of pulse storage units to said first read-out unit, said first read-out unit sending control signals to query each of said pulse storage units through said connector means such that said pulse storage units will respond by transferring the number of said stored pulse signals to said first read-out unit, said number of pulse signals being stored and processed in said read-out unit and subsequently transferred to said central computer;

said module being constructed to connect to another consolidator module such that said first read-out unit receives the number of stored pulse signals from substantially all of said pulse storage units connected to said modules;

wherein the first read-out unit comprises a portable reader processor having a portable computer connected to a sounding rod for connection to the consolidator module in order to read from the pulse storage units directly.

17. An autonomous pulse reading and recording system for expediting collective and individualized reading of a plurality of meters that generate pulse signals indicative of the status of said meters, said system being constructed such that reading is effectuated in one of a direct mode and a radio transmission mode, comprising:

a central computer for processing said pulse signals received from the meters;

means for storing said generated pulse signals comprising a plurality of pulse storage units one each connected to each of the meters, each of said pulse storage units being constructed to connect to a number of other of said pulse storage units, each of which is also connected to a respective meter;

a consolidator module housing a predetermined group of said pulse storage units;

a first read-out unit;

a connector means in said module for simultaneously connecting said group of pulse storage units to said first read-out unit, said first read-out unit sending control signals to query each of said pulse storage units through said connector means such that said pulse storage units will respond by transferring the number of said pulse signals to said first read-out unit, said pulse signals being stored and processed in said read-out unit and subsequently transferred to said central computer;

said module being constructed to connect to another consolidator module such that said first read-out unit receives the number of stored pulse signals from substantially all of said pulse storage units connected to said modules;

wherein each of said pulse storage units has a battery, the first read-out unit being provided with a battery means that powers said read-out unit and each of the pulse storage units when said pulse storage units are queried such that consumption of said batteries in said pulse storage units is minimized.

* * * * *